United States Patent [19]

Ghosh et al.

[11] Patent Number: 4,511,428
[45] Date of Patent: Apr. 16, 1985

[54] METHOD OF CONTROLLING OXYGEN CONTENT AND DISTRIBUTION IN GROWN SILICON CRYSTALS

[75] Inventors: Hitendra Ghosh, Bloomfield Hills, Mich.; Ashok Murgai, Wappingers Falls; Wolfgang A. Westdorp, Hopewell Junction, both of N.Y.

[73] Assignee: International Business Machines Corporation, Armonk, N.Y.

[21] Appl. No.: 396,986

[22] Filed: Jul. 9, 1982

[51] Int. Cl.$^3$ .............................................. C30B 15/20
[52] U.S. Cl. ............................. 156/601; 156/617 SP; 156/DIG. 64; 156/618
[58] Field of Search ............... 156/601, 617 SP, 618, 156/DIG. 64; 422/249

[56] References Cited

U.S. PATENT DOCUMENTS

| 2,998,335 | 8/1961 | Dehmelt | 156/617 SP |
| 3,359,077 | 12/1967 | Arst | 156/619 |
| 3,493,770 | 2/1970 | Dessauer et al. | 156/601 |
| 3,607,139 | 9/1971 | Hanks | 422/249 |
| 3,621,213 | 11/1971 | Jen et al. | 156/617 SP |
| 3,795,488 | 3/1974 | Oliver | 422/249 |
| 3,929,557 | 12/1975 | Goodrum | 156/618 |
| 3,934,983 | 1/1976 | Bardsley et al. | 156/617 SP |
| 3,951,729 | 4/1976 | Takagi et al. | 156/617 SP |
| 4,040,895 | 8/1977 | Patrick et al. | 422/249 |
| 4,239,585 | 12/1980 | Köhl | 156/617 SP |

FOREIGN PATENT DOCUMENTS

| 42901 | 1/1982 | European Pat. Off. | 156/617 SP |
| 9174 | 1/1979 | Japan | 156/601 |
| 150377 | 11/1979 | Japan | 156/617 SP |
| 141536 | 5/1980 | Japan | 156/617 SP |

OTHER PUBLICATIONS

T. C. Digges, Jr., A Solution for Melt-Level Control when Growing Czochralski Silicon Crystals in Hemispherical Quartz Crucibles, Feb. 1975 Solid State Technology, pp. 44–48.
W. N. Borle et al., Silicon Crystals Almost Free of Dislocations, Journal of Crystal Growth, No. 2 (1971), pp. 223-225.

Primary Examiner—David L. Lacey
Attorney, Agent, or Firm—Robert E. Sandt

[57] ABSTRACT

An improved method of growing silicon crystals by the Czochralski method to obtain a desired oxygen concentration level with both axial and radial uniformity. A crucible is located within a heater to achieve a given temperature profile which is related to the oxygen concentration, and then raised and rotated at an increasing speed together with a high crystal rotation rate to achieve the uniformity.

11 Claims, 1 Drawing Figure

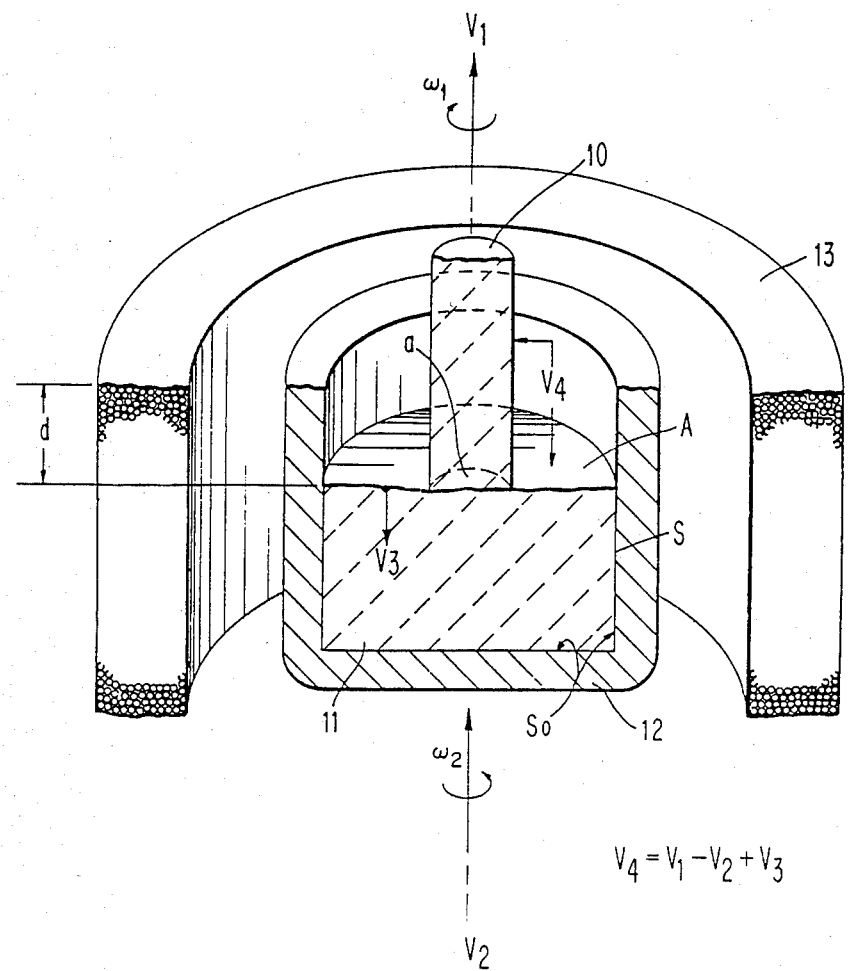

4,511,428

METHOD OF CONTROLLING OXYGEN CONTENT AND DISTRIBUTION IN GROWN SILICON CRYSTALS

TECHNICAL FIELD

This invention relates to crystal growing and more particularly to the growing of silicon crystals by the Czochralski method.

DISCUSSION

The evolution of semiconductor devices from discrete devices to large scale integrated circuits and very large scale integrated circuits imposes very severe limitations upon the properties of the materials used in their fabrication. The microscopic dimensions of the semiconductor devices and the processes for fabricating these devices require that both the macroscopic and microscopic properties of the materials be scrupulously controlled.

Fabrication begins with the growing of a large cylindrical crystals, from which very thin wafers are sliced. Subsequent processing steps fabricate many discrete chips on the thus-sliced wafer, each chip consisting of many interconnected integrated circuits. While the chips are discrete and subsequently broken apart for mounting in modules, the fabrication of the chips is a gross fabrication process wherein all chips on a wafer are simultaneously subjected to the same succession of processing steps, possibly modified through use of different masks to selectively alter the structure of individual chips, if all chips on a wafer are not intended to be identical in structure. The crystalline structure of any one silicon wafer must perforce be uniform throughout the active area of the chip wherein the semiconductor devices are to be fabricated, so that the crystal structure will have a uniform response to all process steps. Absent this uniformity, there will be a high rejection rate (scrap) of the fabricated chips.

The axial distribution of material properties in the as-grown crystal is equal in importance to the radial distribution. If there is an excessive axial gradient in material properties, the number of usable wafers obtained from any given crystal will be materially reduced, resulting in expensive scrap, or will necessitate the sorting of the wafers for different end uses according to the material properties.

Since the whole fabrication process begins with the crystal, it is necessary, not only to understand the chemistry and physics of the material, but also to understand the effect of all of the processing steps upon the material properties, and the effect of those properties upon the final device performance.

Oxygen content and its distribution in the crystal is an important contributing factor to semiconductor performance. In the Czochralski process silicon crystals are commonly grown from a melt contained in a silica-lined or silica crucible. Dissolution of the silica during growth introduces significant amounts of oxygen into the melt and into the growing crystal. The distribution of oxygen in the crystal is normally non-uniform, both on a macro and micro scale and is influenced by the growth parameters employed. The concentration level of oxygen is above the limits of solid solubility of silicon over the range of temperatures normally employed in integrated circuit processing. A significant amount of oxygen thus forms $SiO_2$ micro-precipitates during these thermal treatments. These micro-precipitates can getter metallic impurities and have been so employed during large scale integrated circuit fabrication.

BACKGROUND ART

Various prior art practitioners have sought to control oxygen in the as-grown silicon crystals. Typical of these are those now to be described.

U.S. Pat. No. 2,998,335 issued Aug. 29, 1961 to Dehmelt describes a method of moving the heater axially with respect to the crucible during crystal growth. Also during growth both the crystal and crucible are rotated and the crystal is moved axially with respect to the melt surface.

U.S. Pat. No. 3,359,077 issued Dec. 19, 1969 to Arst discloses a method wherein the crucible position is initially adjusted such that as the melt level in the crucible recedes, the level changes within the constant temperature region of the heater.

U.S. Pat. No. 3,929,557 issued Dec. 30, 1975 to Goodrum, teaches the alternate acceleration and deceleration of the crystal rotation rate to improve crystal quality.

U.S. Pat. No. 3,953,281 issued Apr. 27, 1976 to Pantusco et al. discloses a Czochralski crystal growing apparatus with separately controllable means for providing independent rotational and axial movement of the crystal and crucible. The teaching is to maintain the melt surface within the isothermal region of the heater.

The so-called crucible interrupt method of crystal growth is disclosed in U.S. Pat. No. 4,040,895 issued Aug. 9, 1977 to Patrick et al.

The Koehl U.S. Pat. No. 4,239,585 issued Dec. 16, 1980, teaches increasing the rotational speed of the crystal as the growth proceeds.

While each of the foregoing practitioners sought to control oxygen and/or improve crystal quality, none of them provided an interrelated control over the critical process parameters to achieve a uniform radial oxygen distribution, a uniform axial distribution, or a uniform oxygen distribution in both the radial and axial directions in the as-grown crystal.

SUMMARY OF THE INVENTION

In accordance with this invention a process is provided for controlling the oxygen concentration and gradient in a silicon crystal grown by means of the Czochralski process by means of combinations of the process parameters of initially adjusting the melt level with respect to the heater, continuously raising and rotating the crucible with respect to the heater, and varying the crucible rotation rate all according to predetermined algorithmic relationships.

DESCRIPTION OF THE DRAWINGS

The FIGURE represents schematically a generic type of commercially available crystal growing apparatus adapted to grow crystals by the Czochralski method. The apparatus has been illustrated in this manner to emphasize the relationship of the process variables and simplify the application of the algorithmic relationships to the process.

The crystal 10 is pulled from the melt 11 by mechanisms (not shown) capable of raising the crystal at a linear velocity $V_1$ and rotating it with a rotational rate of $\omega_1$ (RPM). The crystal 10 after the initial growth transition from the seed has a constant cross-sectional area "a", up to the tailing off of the crystal at the end of growth.

The melt 11 is contained in a crucible 12 fabricated of silica or lined with silica. The crucible is capable of being raised with a linear velocity of $V_2$ and rotated at an angular rate of $\omega_2$ (RPM). The area of the crucible inner surface exposed to the molten silicon is denoted by the letter S, and So is the initial inner surface area at startup. "A" designates the area of the melt exposed to the ambient in the absence of the crystal.

The crucible is heated by means of a heater 13 which may be a carbon resistance heater. The vertical displacement of the melt surface with respect to the top of the heater 13 is designated by the character d.

If an R.F. induction heater is used to heat the melt, the heater per se does not become hot. Rather, the melt is heated by the induced field which produces thermal gradients in the melt. The initial position of the crucible is set with respect to the heater so that the temperature gradient in the melt has the desired relativity with respect to the crystal-melt interface.

$V_3$ designates the rate of decrease (velocity) of the melt surface with respect to the crucible and is positive in the direction of the arrow. $V_4$ is the velocity of the crystal with respect to the melt surface.

The interrelationships, hereinafter to be explained and developed, are related to the steady state conditions achieved after the crystal has achieved its desired diameter and prior to tailing off.

It is axiomatic that since the melt provides the material to grow the crystal, the crystal growth rate (CR) is equal to the melt depletion rate (DR). If both the crystal growth rate and the melt depletion rate are expressed in weight change per unit time, this is strictly true. If, however, one ignores the change in volume upon solidification and the coefficient of expansion, then the rate of change of the volume of the crystal and the rate of change of volume of the melt are approximately equal. Since the temperature of the melt and that of the crystal at the interface are substantially equal then the volume change upon solidification is the greater effect. However, this inaccuracy is very small compared with the range of values from which the process constants may be selected. Typically, the ratio of the maximum to minimum values of the constants is 2:1. This leads to a material simplification of the development of the algorithm which defines the interrelationship of the various process parameters. Therefore under steady state growth conditions the growth rate and melt depletion rate can be expressed as follows:

$$CR = aV_4 = DR = AV_3 \tag{1}$$

from which $V_4$ can be expressed as $$V_4 = (A/a) V_3 \text{ or } V_4 = K_0 V_3 \tag{2}$$

wherein $K_0$ equals the ratio of crucible cross-sectional area (A) to the cross-sectional area (a) of the crystal, and is a constant during the steady state growth period, assuming a cylindrical crucible in the operational portion thereof. A similar analysis will be applicable for a non-cylindrical crucible cross-section also, so long as the solidification rate is taken into account.

In addition to establishing an initial vertical displacement of the crucible with respect to the heater (to be defined later), the rate of elevation ($V_2$) of the crucible is controlled to be greater than the rate ($V_3$) at which the melt level recedes in the crucible. Therefore $$V_2 > V_3, \text{ or} \tag{3}$$

$$V_2 - \Delta V_2 = V_3 \tag{4}$$

The $\Delta V_2$ has been established (for the commonly employed crystal and crucible diameters) through experimentation as a constant times the crystal lift rate wherein the constant $K_1$ ranges from 0.08 to 0.190 with 0.125 being the preferred value. This leads to the relationship $$\Delta V_2 = K_1 V_1 \tag{5}$$

wherein $K_1 = 0.08$ to 0.190 (range) with 0.125 being the experimentally determined optimum value for the crystal and crucible diameters commonly employed.

Substitution for $\Delta V_2$ in equation (4) the value from (5) we obtain the relationship $$V_3 = V_2 - K_1 V_1 \tag{6}$$

Referring to FIGURE it will be readily apparent that the crystal lift rate ($V_1$), crucible lift rate ($V_2$), rate of melt level subsidence ($V_3$) and the relative velocity of the crystal with respect to the melt level ($V_4$) can be equated by the following:

$$V_4 = V_1 - V_2 + V_3 \tag{7}$$

Substituting the value of $V_4$ from equation (2) and that for $V_3$ from (6) yields the following:

$$K_0 V_3 = V_1 - V_2 + V_3 \tag{8}$$

Solving (8) for $V_3$ produces:

$$V_3 = \frac{V_1 - V_2}{K_0 - 1} \tag{9}$$

Equating (9) and (6) and simplifying produces the relationship $$V_2 = V_1 \left( \frac{1 - K_1 + K_0 K_1}{K_0} \right) \tag{10}$$

It will be readily appreciated that equation (10) confirms what one might intuitively conclude, that the crystal pull rate bears a constant relationship to the lift rate.

There remains the establishment of the optimum pull rate, and derivatively the optimum crucible lift rate. These have been established empirically by growing crystals, slicing wafers therefrom and measuring the oxygen content and distribution. The governing relationships have been determined to be:

$$\frac{CR}{A - a} = K_2 \text{ and} \tag{11}$$

$$\frac{CR}{So} = K_3$$

wherein
CR = the crystallization rate expressed in $CM^3/hr$.

A = the cross sectional area of the crucible, expressed in $CM^2$ $S_o$ = the initial area of the crucible exposed to the molten silicon.

It will be noted that both $K_2$ and $K_3$, by dimensional analysis, reduce to CM/hr, a velocity.

Note: The volume change of silicon upon solidification has been neglected because of the range of values from which $K_2$ and $K_3$ have been selected.

Referring back to equation (1) wherein the crystallization rate was equated to the depletion rate, the latter being equal to $AV_3$ and substituting this value in both (11) and (12) we obtain:

$$\frac{AV_3}{A-a} = K_2 \tag{11a}$$

$$\frac{AV_3}{S_o} = K_3 \tag{12a}$$

which relationships can be simplified and converted to:

$$V_3 = K_2 \frac{A-a}{A} \tag{11b}$$

$$V_3 = \frac{S_o}{A} K_3 \tag{12b}$$

By substituting the value of $V_3$ from (6) in (11b) the two simultaneous equations and the value of $V_3$ from (9) in (12b) and solving after these substitutions, the following is obtained:

$$V_1 = \frac{K_2\left(A - \frac{a}{A}\right) + K_3\left(\frac{S_o}{a} - \frac{S_o}{A}\right)}{1 - K_1} \tag{13}$$

During this solution, substitution of (A/a) for $K_0$ (2) eliminates $K_0$ in the relationship and provides the respective geometric ratios of crucible cross-sectional area to crystal cross-sectional area ($S_o/a$) and crucible-melt surface area to crucible cross-sectional area ($S_o/A$). The remaining constants $K_1$, $K_2$ and $K_3$ are chosen empirically within the following ranges.

(14) $K_1$ = 0.08 to 0.190 with 0.125 preferred. (dimensionless ratio)

(15) $K_2$ = 0.665 to 1.33 cm/hr with 0.89 being the preferred value

(16) $K_3$ = 0.083 to 0.166 with 0.121 being the preferred value

The remaining process parameters to be defined are:
d = initial position of melt level with respect to the heater.
$\omega_1$ = crystal rotation rate
$\omega_2$ = crucible rotation rate.

Since the distance "d" (vertical relativity of the crucible with respect to the heater) is a function of the apparatus selected for the crystal growing process, it is not feasible to provide a specific linear dimension for it. Rather, some general guidelines can be established together with an experimental test protocol which will yield data that can be converted by computation to an initial vertical displacement of the crucible with respect to the heater in any given apparatus.

It has been demonstrated in tests that an interrelationship exists between the seed-end oxygen concentration and the thermal gradients in the melt, which gradients can be adjusted by varying the starting position of the crucible. Since dissolution of the silica lining contributes oxygen to the melt, and derivatively to the crystal, it has been found that low starting positions result in low seed-end oxygen concentration levels and vice versa. As was indicated (equation 3) the crucible lift rate is preferred to be greater than the melt level subsidence rate, so that even though the melt surface may begin deep within the heater it will gradually rise to a higher position in the heater as the crystal growth progresses.

The experimental protocol for determining the vertical starting position of the crucible is to insert the crucible with the requisite silicon charge into the crystal growing apparatus and grow a boule of the diameter of the desired crystal from the melt while the boule and crucible are rotated in opposite direction at the speeds to be used in the subsequent actual crystal pulling. In the preferred measurement protocol the crucible rotation rate is at least 8 R.P.M., preferably 10 R.P.M., and the crystal rotation rate is in excess of 15 R.P.M., preferably 30 R.P.M. Whether the boule is polycrystalline or mono-crystalline is in this experiment immaterial, as it is the intent of this experiment to achieve the hydrodynamic flow conditions of an actual crystal growing process so as to produce substantially the same temperature profile in the crucible.

When the temperatures have stabilized, temperature measurements are made in the melt starting at the surface of the melt and working vertically down the side of the crucible to bottom and thence radially to the center, using a silica-sheathed thermocouple of the smallest practical size so as not to produce undue perturbations in the melt by virtue of the presence of the thermocouple.

The thus-taken temperature measurements are then tabulated and averaged to obtain an average temperature Tc. This measurement and average temperature computations are then repeated for a plurality of relative positions of the crucible with respect to the heater and similarly tabulated. The result will be a table of values correlating Tc (average temperature) to crucible height for the specific selected conditions of this particular apparatus.

The next step is to select a desired oxygen concentration level in p.p.m.a. (as measured by the procedure specified in ASTM F121-76) and to compute the approximate Tc necessary to achieve this oxygen concentration from the expression $$Tc = 0.06504 \frac{S_o}{A-a} (O_2' \text{ conc.}) \tag{17}$$

wherein:
Tc = temperature in degrees Celsius
So = area (in $CM^2$) of crucible exposed to melt
A = area (in $cm^2$) of horizontal melt surface
a = area (in $cm^2$) of section of desired crystal size
$O_2$ conc = the oxygen concentration in p.p.m.a. as measured by the ASTM method or converted thereto NOTE: This relationship is applicable only to apparatus parameters wherein the Taylor number = $7.1 \times 10^6$ (crystal speed is 30 R.P.M., crucible speed is −10 R.P.M., crystal diameter is 8.25 cm. and crucible diameter is 25.4 cm.) (Other rotation rates will produce a different Taylor number and a different multiplier constant. [in equation 17]).

The foregoing relationship between Tc and the oxygen content has been determined empirically from tests. No relationship has been established between oxygen concentration and the Taylor number, but for the same Taylor number defined by the following formula, the relationship of Tc to the ratio of areas and oxygen content in p.p.m. will be valid. The Taylor number can be computed from the following relationship:

$$T_n = \frac{4\Omega_1^2 R_1^2 (1 - \mu)(1 - \mu/\eta)}{\gamma^2 (1 - \eta^2)^2} \quad (18)$$

wherein:
$\Omega_1$ = angular velocity of crystal in radians/second
$R_1$ = radius of crystal (cm)
$\mu = \Omega_2/\Omega_1$
$\Omega_2$ = angular velocity of crucible in radians/second
$\eta = R_1/R_2$
$R_2$ = radius of crucible (cm$^1$)
$\gamma$ = kinematic viscosity in c.g.s. units Having determined the necessary Tc to obtain the required oxygen concentration one then refers to the table correlating Tc to the crucible height, and selects the corresponding crucible height.

This crucible height and the parameters chosen for the temperature measurements (crystal and crucible RPM) are then used to initiate subsequent production of crystal growths.

To illustrate the application of these principles to an actual case, reference is made to the following table.

| Crystal Number | Rotation Rate Crystal/Crucible R.P.M. | Crucible Location cm | TC | Tc/So A-a | O$_2$ conc. |
|---|---|---|---|---|---|
| 1 | 30/−10 | .00 | 1628 | 560.2 | 33.84 |
| 2 | " | −1.27 | 1594 | 548.5 | 31.83 |
| 3 | " | −2.54 | 1419 | 488.5 | 30.29 |
| 4 | " | −3.81 | 1468 | 505.2 | 28.31 |

The foregoing data applies to a 10 inch (25.4 cm) crucible with a 12 Kg melt, a crystal diameter of 8.25 cm and rotation rates as shown, in a Hamco 2000RC puller, wherein the Taylor number is $$\frac{7.1 \times 10^6}{\eta}$$

for these conditions. The same approach has been experimentally verified to be applicable to other types of crystal pulling apparatus.

While the relationship $$Tc / \frac{So}{A - a}$$

is generic to a variety of crystal growing apparatus, crucible sizes, melt size, and crystal sizes, the correlation between $$Tc / \frac{So}{A - a}$$

and the oxygen content is valid for only a given Taylor number. This is because the hydrodynamic flow conditions within the melt are affected by the stirring of the melt by the crystal and crucible rotation rates. However, for another Taylor number (other combinations of crystal and crucible rotation rates) the interrelation between $$Tc / \frac{So}{A - a}$$

and the oxygen content may be determined from the test protocol described above.

Having performed the test measurements to determine the temperature profile, one utilizes this in subsequent production crystal growing to obtain the desired seed-end oxygen content. The axial uniformity is controlled by the crucible lift and rotation rates. The radial uniformity is assured by employing high crystal rotation rates (greater than 15 R.P.M.) with 30 R.P.M. being the preferred value.

The crucible rotation rate is increased from its initial rate preferably 8 R.P.M. to a maximum, which maximum should be at least a few R.P.M. less than the crystal rotation speed. The preferred difference is 10 R.P.M. The average rate of increase in the crucible rotation speed, defined as the maximum speed minus the initial speed divided by the maximum fraction of melt solidified into the crystal, lies in the range of 0.5 to 5 R.P.M. with 2.5 R.P.M. being the preferred value for an average of every 0.1 of fraction of melt solidified.

Thus, a preferred production process would consist of (1) adjusting the crucible height in accordance with the computed relationship; (2) rotating the crucible and crystal at the predetermined relative speeds; (3) dipping the seed and initiating crystal growth; (4) allowing the crystal to achieve its full desired diameter and then; (5) varying the rotation crucible and lift rates in accordance with the previously stated relationships. Because of the automatic controls and servo mechanisms within the crystal puller, the crystal lift rate and heater power will be automatically varied to maintain a constant crystal diameter. The servo-controlled variations in crystal lift will, therefore, produce positive and negative excursions about the average value for the crystal lift rate. Sensors incorporated in the equipment provide data as to crystal rotation and lift position to permit the derivative computations to be made in real time for control of the crucible rotation and lift rate. Since the position of the crystal is measurable, and the diameter is closely controlled, its volume is a linear function of the crystal position with respect to the melt surface.

Thus, in summary, the oxygen concentration at the seed end of the crystal is controlled by the starting position of the crucible. The axial uniformity is achieved by varying the crucible lift and rotation rates, and the radial uniformity is controlled by employing a fast crystal rotation rate.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:
1. In the method of growing silicon crystals by the Czochralski method, wherein a seed crystal is inserted into a bath of silicon in a crucible maintained molten by a heater and slowly withdrawn therefrom to grow a crystal substantially larger than the seed crystal, the improvement in controlling the lift rate of the crucible to achieve axial uniformity in the oxygen concentration in the as-grown crystal comprising;

raising the crucible in the heater at a rate which exceeds the rate at which the melt level in the crucible recedes.

2. The improvement in the method of growing crystals as defined in claim 1 wherein the rate at which the crucible is raised is defined as:

$$V_2 = V_1\left(\frac{1 - K_1 + K_o K_1}{K_o}\right)$$

wherein
$V_2$ = crucible lift rate in cm/hr.
$V_1$ = crystal lift rate in cm/hr.
$K_o$ = A/a wherein
A = the horizontal area of the melt surface in the absence of a crystal in cm$^2$
a = the cross-sectional area of the crystal in cm$^2$
$K_1$ = a dimensionless constant chosen from the range of values from 0.08 to 0.19 with 0.125 being the preferred value.

3. An improvement in the method of growing silicon crystals by the Czochralski method to achieve a desired oxygen concentration in the crystal comprising the steps of:

a. inserting a crucible with a known charge of silicon material into the crystal growing apparatus and melting the charge, b. while rotating the seed crystal at a speed in excess of 15 R.P.M. and the crucible at a speed in excess of 8 R.P.M. in the opposite direction, dipping the seed into the melt and growing a boule of the diameter of the desired crystal, c. upon achieving the desired diameter, measuring the temperature of the melt beginning at the surface of the melt adjacent to the crucible wall and downward therefrom to the bottom of the crucible and radially inward to the center of the crucible, d. computing the average of the thus-measured temperatures to obtain Tc, e. changing the vertical position of the crucible to a plurality of different positions and repeating the temperature measurements and computation of Tc for each different position of the crucible, f. producing a table of values of crucible height as a function of the computed values of Tc, g. selecting a value of the oxygen concentration as measured by the method specified in ASTM standard, for the subsequently to-be-grown crystal, h. computing the value of Tc necessary to achieve the approximate desired oxygen concentration from the relationship:

$$Tc = 0.06504\left(\frac{A - a}{So}\right) (O_2 \text{ conc.})$$

wherein
Tc = temperature in degress Celsius
A = area (in Cm$^2$) of horizontal melt surface
a = cross-sectional area (in Cm$^2$) of desired crystal
So = area (in Cm$^2$) of the crucible exposed to the melt at startup
$O_2$ conc. = concentration of $O_2$ in p.p.m.a. as determined by the ASTM F121-76 method, or equivalent methods with conversion thereto, i. selecting a crucible height corresponding to the thus-computed Tc from said table of values, and j. positioning the crucible at the thus-selected height in the subsequent actual crystal growing process and proceeding with the crystal growing.

4. In the method of growing silicon crystals from a molten bath of silicon contained in a heated crucible by the Czochralski method the improvement in controlling the lift rate of the crucible so as to achieve axial uniformity in the oxygen concentration in the as-grown crystal comprising;

raising the crucible such that the rate at which it is lifted is defined by $$V_2 = V_1\left(\frac{1 - K_1 + K_o K_1}{K_o}\right)$$

wherein
$V_2$ = the crucible lift rate in cm/hr.
$V_1$ = the crystal lift rate in cm/hr.
$K_o$ = A/a wherein
A = the horizontal area of the melt surface in the absence of a crystal in cm$^2$
a = the cross-sectional area of the crystal in cm$^2$
$K_1$ = a dimensionless constant chosen from the range of values from 0.08 to 0.19, with 0.125 being the preferred value.

5. In the method of growing a silicon crystal by the Czochralski method, the improvement in controlling the crucible height with respect to the heater, the crucible rotation rate, and the crystal rotation rate so as to achieve a uniform axial and radial distribution of oxygen in the as-grown crystal comprising the steps of;

locating a crucible containing molten silicon within the heater of a crystal growing apparatus at a height with respect to a heater determined by the following succession of experimental steps performed prior to the growing of an actual crystal for subsequent use:

(a) inserting a crucible with a known charge of silicon material into a crystal growing apparatus subsequently to be used for growing a crystal and melting the charge, (b) while rotating a seed crystal at a speed in excess of 15 R.P.M. and the crucible at a speed in excess of 8 R.P.M. in the opposite direction, dipping the seed into the melt and growing a boule of the diameter of the desired crystal, (c) upon achieving the desired diameter, measuring the temperature of the melt beginning at the surface of the melt adjacent to the crucible wall and downward therefrom to the bottom of the crucible and radially inward to the center of the crucible, (d) computing the average of the thus-measured temperatures to obtain Tc, (e) changing the vertical position of the crucible to a plurality of different positions and repeating the temperature measurements and computation of Tc for each different position of the crucible, (f) producing a table of values of crucible height as a function of the computed values of Tc, (g) selecting a desired value of the oxygen concentration as measured by the method specified as ASTM standard F121-76, for the subsequently to-be-grown crystal, (h) computing the value of Tc necessary to achieve the approximate desired oxygen concentration from the relationship:

$$Tc = 0.06504 \left( \frac{A-a}{So} \right) (O_2 \text{ conc.})$$

wherein

Tc = temperature in degrees Celsius
A = area (in Cm$^2$) of horizontal melt surface
a = cross-sectional area (in Cm$^2$) of desired crystal
So = area (in Cm$^2$) of the crucible exposed to the melt at startup
$O_2$ conc. = concentration of $O_2$ in p.p.m.a. as determined by the ASTM F121-76 method or equivalent methods with conversion thereto, (i) selecting a crucible height corresponding to the thus-computed Tc from said table of values, raising the crucible at a rate in excess of the rate at which the level of the melt in the crucible recedes, increasing the speed of rotation of the crucible as the crystal growth progresses, and rotating the crystal at a speed in excess of 15 R.P.M.

6. The improvement in the method of growing crystals as defined in claim 5 wherein the rate at which the crucible is raised is greater than the rate at which the melt level recedes by a constant times the rate at which the crystal is raised.

7. The improvement in the method of growing crystals as defined in claim 6, wherein the value of the said constant is chosen from the range of values from 0.08 to 0.19.

8. The improvement in the method of growing crystals as defined in claim 5 wherein the average rate at which the crystal is raised is a constant.

9. The improvement in the method of growing crystals as defined in claim 8 wherein the rate at which the crystal is raised is defined as:

$$V_1 = \frac{K_2 \left( A - \frac{a}{A} \right) + K_3 \left( \frac{So}{a} - \frac{So}{A} \right)}{1 - K_2}$$

wherein $V_1$, and $K_3$ are expressed in cm/hr; and
$K_1$ is a dimensionless ratio chosen from within the range of values from 0.08 to 0.9
$K_2$ is chosen from the range of values from 0.665 to 1.33
$K_3$ is chosen from the range of values from 0.083 to 0.166
a is the cross-sectional area (in cm$^2$) of the crystal
A is the area (in cm$^2$) of the horizontal area of the melt surface in the absence of a crystal So is the area (in cm$^2$) of the crucible exposed to the melt at the initiation of crystal growth.

10. The improvement in the method of growing crystals as defined in claim 5 wherein the crucible rotational speed is increased at an average rate chosen from the range of values from 0.5 to 5 R.P.M., the said average rate being defined as the maximum crucible rotational speed minus the initial crucible rotational speed, both expressed in R.P.M., divided by the maximum fraction of the melt solidified into the crystal.

11. The improvement in the method of growing crystals as defined in claim 10, wherein:

the maximum crucible rotational speed is 10 R.P.M. less than the crystal rotational speed;
the initial crucible rotational speed is at least 8 R.P.M., and the average increase in the rotational speed of the crucible is 2.5 R.P.M. for each 1/10 of the melt solidified into the crystal.

* * * * *